United States Patent [19]
Le Goe et al.

[11] Patent Number: 5,315,487
[45] Date of Patent: May 24, 1994

[54] METHOD AND DEVICE FOR CODING PRINTED CIRCUIT BOARDS

[75] Inventors: Gérard Le Goe, La Ville du Bois; Jacques Roger, Guyancourt, both of France

[73] Assignee: Alcatel CIT, Paris, France

[21] Appl. No.: 921,082

[22] Filed: Jul. 29, 1992

[30] Foreign Application Priority Data

Jul. 30, 1991 [FR] France .................. 91 09659

[51] Int. Cl.⁵ .................. H05K 7/14; H01R 13/64
[52] U.S. Cl. .................. 361/796; 361/752; 361/785; 439/377
[58] Field of Search .................. 361/394, 399, 412, 413, 361/414, 415; 211/41; 439/377

[56] References Cited

U.S. PATENT DOCUMENTS

| | | | |
|---|---|---|---|
| 2,958,014 | 10/1960 | Blain | 361/415 |
| 4,745,524 | 5/1988 | Patton, III | 361/399 |
| 4,758,928 | 7/1988 | Wierec et al. | |
| 5,016,142 | 5/1991 | White | |

FOREIGN PATENT DOCUMENTS 0394753 10/1990 European Pat. Off.
8230691 12/1982 Fed. Rep. of Germany.

Primary Examiner—Leo P. Picard
Assistant Examiner—Bot Ledynh
Attorney, Agent, or Firm—Sughrue, Mion, Zinn, Macpeak & Seas

[57] ABSTRACT

A device for associative coding of printed circuit boards comprises a coding member comprising a central longitudinal member, attachment arms and a series of appendages the spacing between which is equal to the spacing between two board guide slideways. The front panel of each board incorporates a coding slot enabling an appendage to pass through it when the latter is aligned with the slot. The position of the coding slot is a characteristic common to all boards of a given family. After a first board is fitted into the subrack only other boards of the same family can be connected into the part of the subrack fitted with the coding member. This prevents the insertion into the same subrack or subrack compartment of boards from different and incompatible families although for a same product type and having the same functionality.

9 Claims, 3 Drawing Sheets

METHOD AND DEVICE FOR CODING PRINTED CIRCUIT BOARDS

BACKGROUND OF THE INVENTION

1. Field of the invention

The present invention concerns a method and a device for coding printed circuit boards adapted to be connected into a subrack adapted to be mounted in a cabinet or a rack. Each board is guided by slideways which are part of a plurality of parallel slideways perpendicular to a backplane of the subrack and has a front panel in the form of a wall perpendicular to its plane adapted to close part of an open front side of the subrack when the board is inserted into the latter.

The method may be used to prevent incorrect insertion of boards into a standardized subrack forming part of a telecommunication installation cabinet or rack. A particular object of the invention is to prevent insertion into the same subrack of boards from different and incompatible families although part of a common type of product and having the same functionality.

2. Description of the prior art

The cabinets or racks used in telecommunication installations each comprise a number of parallelepiped-shape subracks with standardized dimensions and having a rear wall called the "backplane" in the form of a printed circuit board carrying multipin connectors adapted to receive mating connectors each carried by one plug-in printed circuit board and connected to the circuitry on the board, the front side of the subrack opposite the backplane being open to enable the removable insertion of a plurality of parallel boards each in a vertical plane perpendicular to the backplane. Each board has to be inserted at a specific location of the subrack to assure not only correct mechanical coupling but also the electrical coupling implementing the connections needed between the backplane circuit and the board circuit. The boards are guided as they are inserted in order to align the connectors carried by the boards exactly with the respective connectors fixed to the backplane. To this end the subrack is fitted with parallel slideways perpendicular to the backplane.

Each printed circuit board carries a so-called "front panel" perpendicular to its main plane fixed to the edge of the board parallel to that carrying the connector(s) to be plugged into the respective connector(s) fixed to the backplane. The front panel faces the open side of the subrack during and after insertion of the board into the subrack and can carry information concerning the correct location of the board in the subrack. However there is still some risk of misreading or misinterpretation of this information or of handling errors subsequent to such reading, resulting in the incorrect insertion of boards into the subrack.

One known way to eliminate the risk of error in the individual insertion of each board is to adopt an individual coding method whereby for each board there is a coding member fixed to or forming an integral part of at least one connector fixed to the backplane and a respective coding member fixed to or forming an integral part of at least one connector fixed to the board, the two coding members being rendered selectively engagable plug-and-socket fashion by coding achieved (for example) by fitting removable "polarizer keys" to obstruct predetermined openings of a series of identical openings in one member and removing from the other member projecting members in corresponding relationship to the position of the openings closed off by the polarizer keys and part of a series of members adapted to enter the openings of said series.

Adapting this individual coding method to discriminating between different board families for the same type of product and having the same functionality but which are nevertheless incompatible with each other, in other words which represent different technical and/or electrical versions (for example, ECL technology boards and CMOS technology boards), would have the disadvantage of requiring modification to the coding of all connectors fixed to the backplane. One consequence of this would be to rule out the interchangeable use of different families of boards in a given subrack without modifying again the coding of all the backplane connectors, which would require much dexterity and be somewhat time-consuming, once again with a non-negligible risk of errors.

A specific object of the invention is to obviate the disadvantage just mentioned by enabling associative coding of boards according to the family of which they are part, so retaining the interchangeability of boards within a complete family, without modifying the individual coding of the connectors fixed to the backplane or the connectors fixed to the boards.

SUMMARY OF THE INVENTION

In one aspect, the present invention consists in a method of associative coding printed circuit boards adapted to be connected into a subrack adapted to be fitted with a plurality of boards each of which is guided by at least one slideway which is part of a plurality of parallel spaced slideways respective to said boards each of which has a front panel in the form of a wall perpendicular to its plane adapted to close part of an open front side of said subrack when said board is inserted in said subrack, in which method, before inserting the first board, at least one elongate coding member is fitted to said subrack and comprises a series of projecting portions disposed along the length of said member at intervals in corresponding relationship to respective intervals between two consecutive slideways, each projecting portion being adapted to collaborate plug-and-socket fashion with an opening formed in the front panel of each board to enable said board to be connected only if it is part of the same family as the first board mounted and connected into the subrack, said coding member being disposed parallel to the plane of the open front side of the subrack and adapted to be movable longitudinally for fitting the first board of the family, the coding of the boards of the same family being defined by the location of said opening in the plane of the front panel of each board.

In a second aspect, the invention consists in a device for implementing a method of associative coding printed circuit boards adapted to be connected into a subrack adapted to be fitted with a plurality of boards each of which is guided by at least one slideway which is part of a plurality of parallel spaced slideways respective to said boards each of which has a front panel in the form of a wall perpendicular to its plane adapted to close part of an open front side of said subrack when said board is inserted in said subrack, in which method, before inserting the first board, at least one elongate coding member is fitted to said subrack and comprises a series of projecting portions disposed along the length of said member at intervals in corresponding relationship to respective intervals between two consecutive slideways, each projecting portion being adapted to collaborate plug-and-socket fashion with an opening formed in the front panel of each board to enable said board to be connected only if it is part of the same family as the first board mounted and connected into the subrack, said coding member being disposed parallel to the plane of the open front side of the subrack and adapted to be movable longitudinally for fitting the first board of the family, the coding of the boards of the same family being defined by the location of said opening in the plane of the front panel of each board, which device comprises at least one elongate coding member provided with means for mounting said member inside said subframe and comprising a plurality of parallel projecting ports perpendicular to the length of said coding member at intervals in corresponding relationship to respective intervals between two consecutive guide slideways.

In a first embodiment of this device adapted for use in the case where said slideways are equally spaced the projecting portions are equally spaced at an interval equal to the interval between two consecutive guide slideways.

In another embodiment of this device adapted for use in the case where the intervals between said slideways have one of at least two different values equal to a predetermined value or an integer multiple of said value said projecting members are separated by an interval equal to said predetermined value or an integer multiple of said value.

The invention will be clearly understood from the following detailed description of one specific embodiment of a device for implementing a method in accordance with the invention given by way of non-limiting example with reference to the appended drawings.

DETAILED DESCRIPTION OF THE INVENTION

Figure 1:
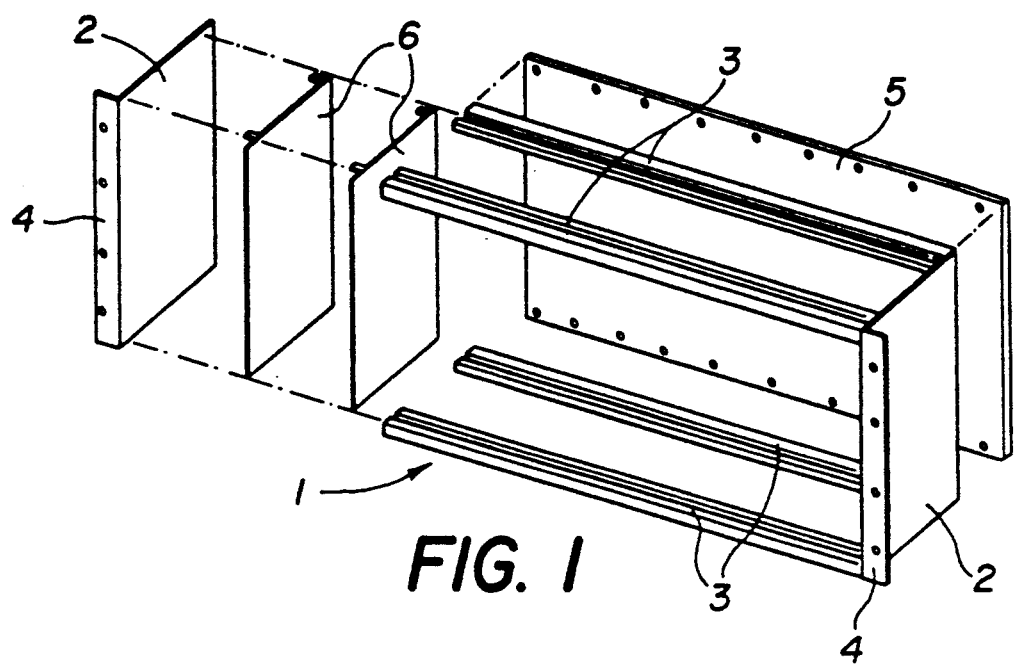
FIG. 1 is a partially exploded perspective view of a subrack adapted to be mounted in a cabinet or a rack and to be equipped with a device in accordance with the invention for associative coding of plug-in circuit boards.
Figure 6:
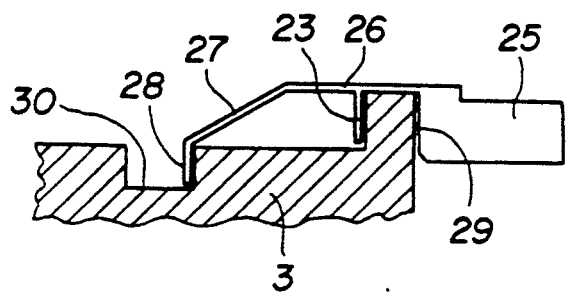
FIG. 6 is a diagrammative transverse cross-sectional view of part of the subrack shown in FIG. 1 fitted with the coding member shown in FIGS. 4 and 5.

Referring to FIG. 1, the subrack 1 is advantageously made from a metal such as aluminum and comprises two symmetrical side flanges 2 joined together by four rails 3 whose cross-section includes a T-shape part (see also FIG. 6). The front edge of each flange 2 has a lip 4 bent at right angles for fixing the subrack 1 to the uprights of the cabinet or the rack (not shown). The back of the subrack 1 is closed by a backplane 5 carrying a printed circuit. Internal partitions 6 subdivide the interior of the subrack 1 into a plurality of compartments. Slideways (like the bottom slideway 17 shown in FIG. 7) for guiding the printed circuit boards are fixed to the top and bottom rails 3 in facing pairs. The circuit boards are installed on edge in a plane parallel to that of the side flanges 2 and the internal partitions 6.

Figure 7:
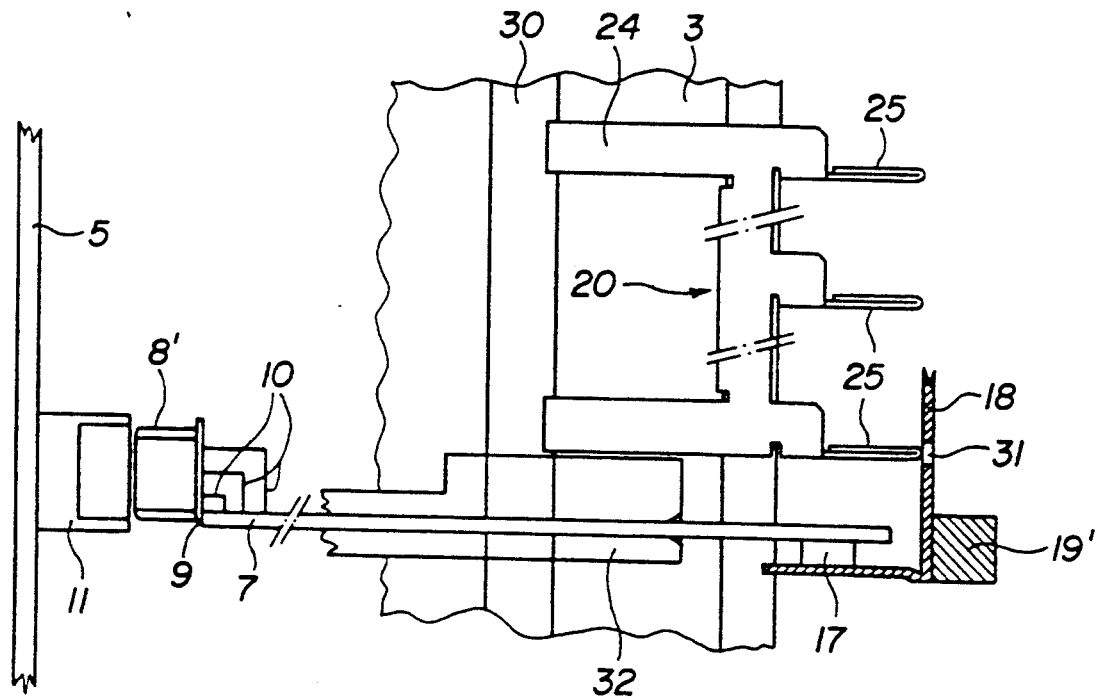
FIG. 7 is a plan view showing the positioning of a printed circuit board fitted with a coding device in accordance with the invention in the subrack from FIG. 1 fitted with the coding member shown in FIGS. 4, 5 and 6.

Each printed circuit board 7 carries at least one male connector 8—8' (FIGS. 3 and 7) fixed to the rear edge 9 of the board 7 and connected to the circuit of the board by a plurality of connections 10 (FIG. 7). As shown in this latter figure, each connector 8' is adapted to plug into a respective female connector 11 fixed to the backplane 5 and shown in perspective in FIG. 2.

Figure 2:
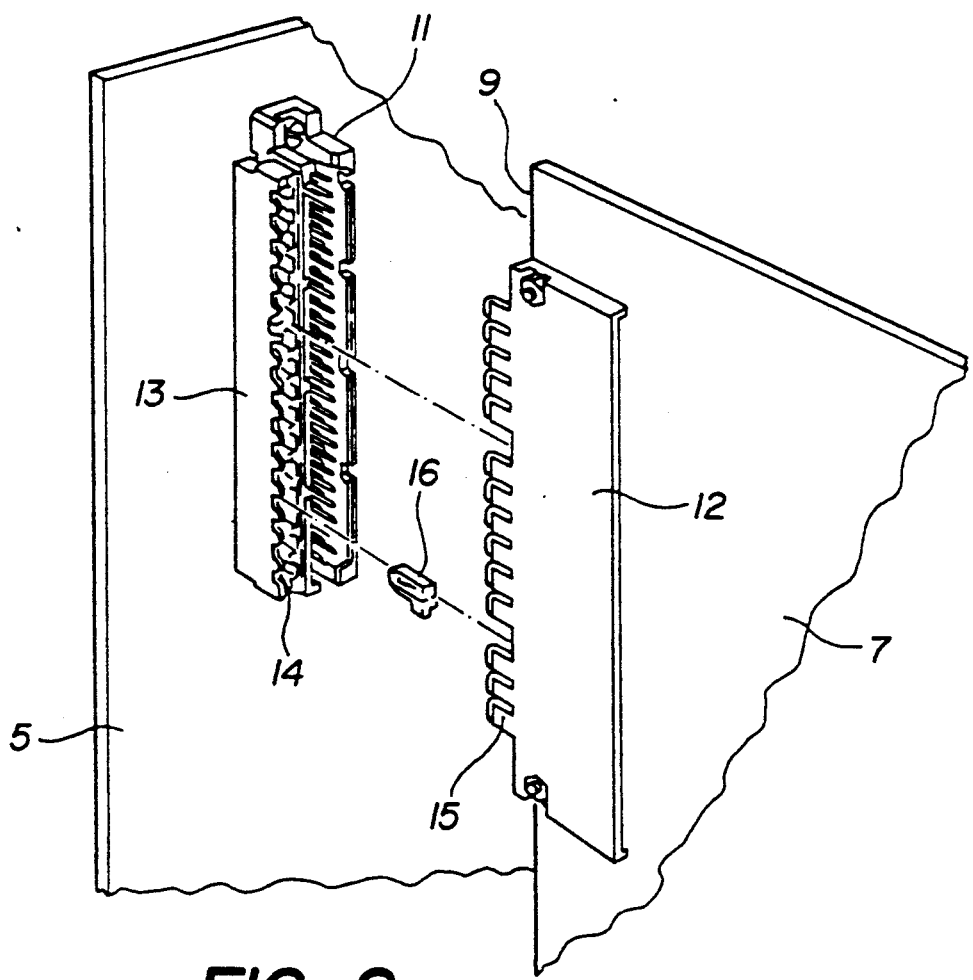
FIG. 2 is a perspective view of a first multipin connector fixed to the backplane of the subrack shown in FIG. 1 and part of a printed circuit board carrying a second connector adapted to be connected to said first connector, each of the two connectors being provided with an individual board coding member which is part of a known type coding device.
Figure 3:
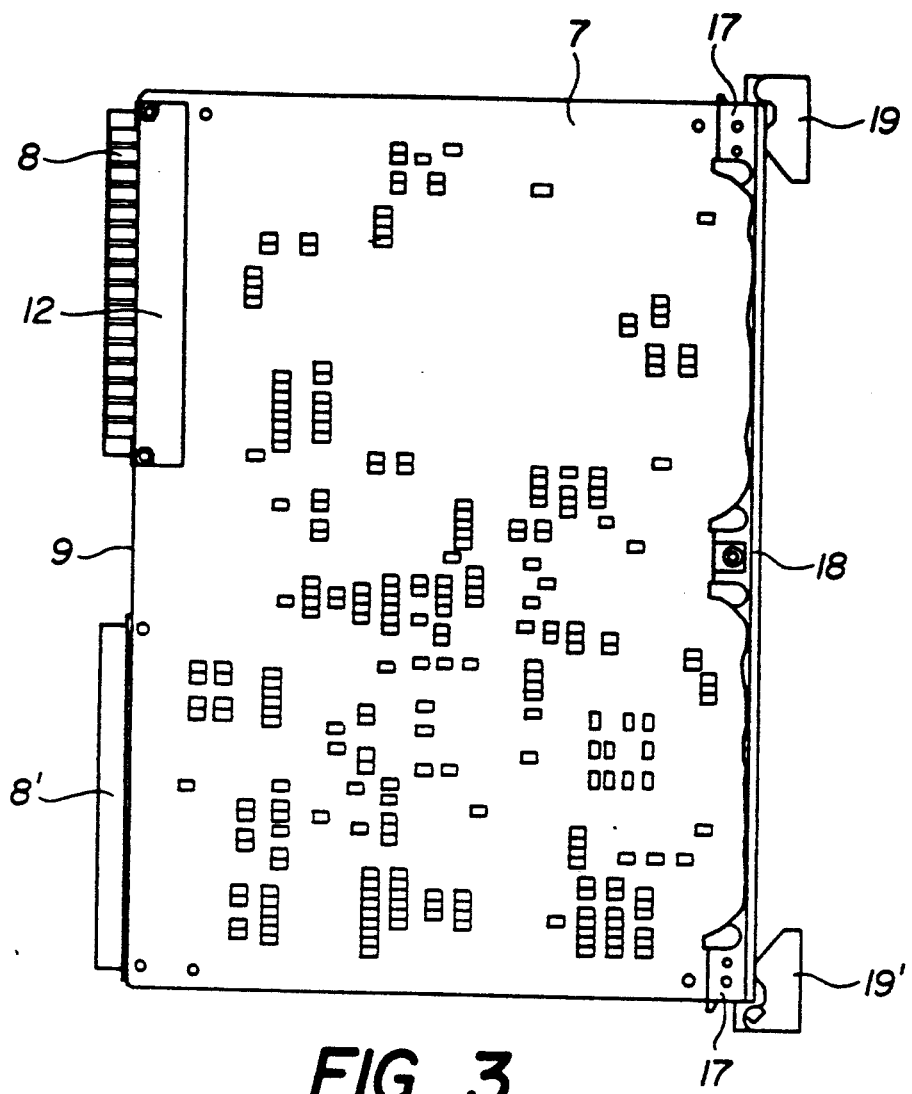
FIG. 3 shows a printed circuit board of the kind of which one part is shown in FIG. 2 carrying two connectors of which one is provided with a coding member, a front panel support and two latches for securing the board after it is inserted in the subrack shown in FIG. 1.

Referring to FIG. 2, a male coding member 12 is fixed to the rear edge 9 of the board 7, on the opposite side to that which carries the male connector 8 and exactly in line with the male connector 8 (FIG. 3).

A coding member 13 is molded integrally with the connector 11 or fixed to the connector 11 and comprises a series of identical numbered cavities 14 adapted to allow the insertion of tangs 15 which are part of a series of tangs numbered in corresponding relationship to the numbering of the cavities 14. These tangs project outwards from the edge of the male coding member 12.

Referring to FIG. 2, the individual coding of the board 7 to allow the male connector 8 to be inserted only in the intended female connector 11 is effected by closing off a certain number of the cavities 14 (usually one or two of them) by clipping into the cavities 14 polarizer keys 16 adapted to be easily inserted into or removed from the cavities. The keys 16 are clearly visible by virtue of a color contrast with the female coding member 13. The tangs 15 of the male coding member 12 in corresponding relationship to the cavities 14 closed off by the polarizer keys are broken off to enable insertion of the other tangs 15 into the cavities 14 that remain open.

The board 7, shown in its entirety in FIG. 3, is fitted with two male connectors 8 and 8' fixed to the side of the board 7 carrying the active or passive components. Only the connector 8 fixed to the upper part of the rear edge 9 of the board 7 is provided with a male coding member 12 although it must be understood that the other connector 8' could also be provided with a coding member of this kind and that the connector 8' could be provided with a coding member instead of the connector 8.

The front part of the board 7 is fixed to a front panel support 17 to which the front panel 18 of the board is in turn fixed. Two latches 19 and 19' can be folded down against the front panel 18 of the board 7 to latch the board 7 into the subrack 1 after insertion of the board and complete insertion of the male connectors 8 and 8' into the compartments adapted to receive them in the respective female connectors 11.

Now that the layout of the subrack 1 and of a circuit board 7 fitted in a manner that is known in itself with an individual board coding device have been described, an associative coding method and device in accordance with the invention will be described.

Figure 4:
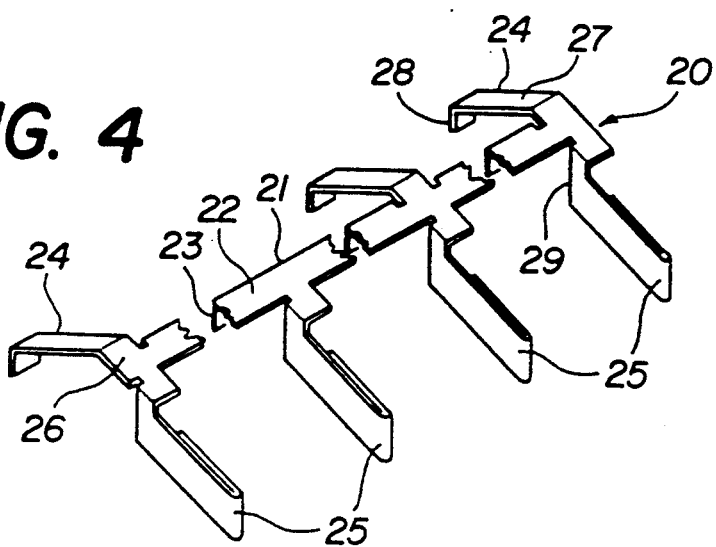
FIG. 4 is a partially cut away perspective view of a board associative coding member in one embodiment of a device in accordance with the invention.
Figure 5:
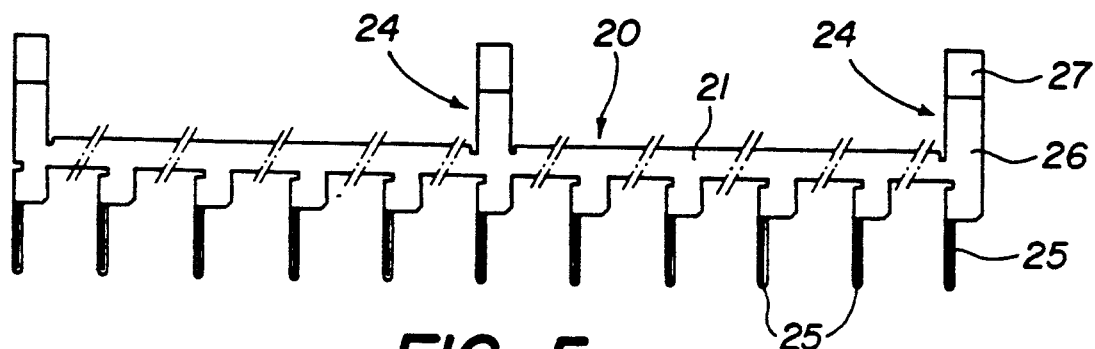
FIG. 5 is a top view of the coding member shown in FIG. 4.

FIGS. 4 and 5 show a member 20 which is used to implement an associative coding method in accordance with the invention. This coding member 20 is advantageously made from sheet metal, preferably stainless steel. It could instead be made from a rigid plastics material, however.

The member 20 has a central longitudinal member 21 with an L-shape cross-section having a top 22 and a lip 23 bent downwards at 90° to the top 22, a plurality of attachments arms 24 (three in the embodiment shown in the drawing) and a plurality of appendages 25 perpendicular to the central longitudinal member 21 and (in the specific embodiment shown in FIGS. 4 and 5) equally spaced in a plane which, when the member is mounted in the subrack 1, is parallel to that of each of the printed circuit boards mounted in the subrack.

The attachment arms 24 have a horizontal part 26 extending from the top 22 of the longitudinal member 21 followed by a downwardly oblique part 27 substantially facing the lip 23 followed by a lip 28 bent into a plane which in the rest condition (in other words, when no deforming force is applied to the arms 24 of the member 20) is at a small angle (10°, for example) to the plane of the lip 23, the lip 28 extending towards the lip 23.

The rear edge of each appendage 25 near and below the level of the top 22 forms a vertical edge 29 parallel to the plane of the lip 23 separated from the latter by a distance equal to the thickness of the upper edge of the section 3 so that the member 20 can be mounted on the section in the position shown in cross-section in FIG. 6. The member 20 is retained to the section 3 by the elasticity of the attachment arms 24, the furthest lip 28 of which bears against a vertical side wall of a groove 30 formed in the section 3 with sufficient elastic force to grip the member 20 onto the section 3. The member 20 is thus fixed to the section 3 with no fixing means (such as a screw) separate from the member itself and can be fitted to or removed from the section 3 instantaneously without using any tools. Also, the member 20 is easy to move longitudinally by sliding it along the section 3 once it has been fitted to the latter.

The member 20 is easily manufactured from metal, e.g. stainless steel plate by stamping and pressing, enabling it to be manufactured industrially at low unit cost. As seen more clearly in FIG. 4, the appendages 25 are formed by bending the metal back on itself which makes them very stiff which is desirable if they are to function correctly in the manner to be explained hereinafter.

Referring to FIG. 7, the front panel 18 of each board 7 has a coding slot 31 through which an appendage 25 can pass when aligned with the coding slot 31. The associative coding of boards 7 belonging to the same family (as defined previously) is effected by using the same position (relative to the plane of the board 7) for the coding slot 31 in the front panel 18 of all the boards 7 of the same family and using a different position of the coding slot for boards 7 from a different family.

When the position (widthwise of the subrack 1, i.e. lengthwise of the rails 3 and the coding member 20) of the guide slideway 32 of a board 7 relative to the coding member 20 is such that an appendage 25 is facing the slot 31 in the front panel of the board, so enabling complete insertion of the male connector 8' into the respective female connector 11 fixed to the backplane 5 and therefore full insertion of the board 7 into the subrack 1 at a location which may optionally be determined by an individual coding device of the known type described above but not shown in FIG. 7, only other boards of the same family as the board 7 can be inserted into the subrack 1 on either side of the partitions 6. Of course, when the first board is inserted into the subrack the coding member may need to be slid along the rail 3 until an appendage 25 is facing the slot in the front panel of the first board.

A single associative coding member 20 may be used in each subrack 1 or part-subrack, advantageously fitted to the bottom rail 3 on the open side of the subrack; however, another, similar coding member 20 may also be used on the top rail 3 and a second slot provided in the front panel 18 of each board 7 laterally offset relative to the slot 31 and cooperating with the appendages 25 of the coding member 20 mounted on the top rail 3, in order to extend the board coding possibilities.

Note that the printed circuit board associative coding device just described is adapted for use in the specific case where the board guide slideways are equally spaced. The device may be adapted for use in the more usual case where the intervals between the board guide slideways (and consequently the widths of the board front panels) have one of at least two different values equal to a predetermined value or an integer multiple of this value. All that is then required is to provide the front panels of boards whose width is a multiple of said predetermined value with a sufficient number of slots 31 or to eliminate the unwanted appendages 25.

What is claimed:

1. Device for implementing a method of associative coding printed circuit boards adapted to be connected into a subrack adapted to be fitted with a plurality of boards each of which is guided by at least one slideway which is part of a plurality of parallel spaced slideways respective to said boards each of which has a front panel in the form of a wall perpendicular to its plane adapted to close part of an open front side of said subrack when said board is inserted in said subrack, in which method, before inserting the first board, at least one elongate coding member is fitted to said subrack and comprises a series of projecting portions disposed along the length of said member at intervals in corresponding relationship to respective intervals between two consecutive slideways, each projecting portion being adapted to collaborate plug-and-socket fashion with an opening formed in the front panel of each board to enable said board to be connected only if it is part of the same family as the first board mounted and connected into the subrack, said coding member being disposed parallel to the plane of the open front side of the subrack and adapted to be movable longitudinally for fitting the first board of the family, the coding of the boards of the same family being defined by the location of said opening in the plane of the front panel of each board, which device comprises at least one elongate coding member provided with means for mounting said member inside said subrack and comprising a plurality of parallel projecting ports perpendicular to the length of said coding member at intervals in corresponding relationship to respective intervals between two consecutive guide slideways.

2. Device according to claim 1 adapted for use in the case where said slideways are equally spaced and wherein said projecting portions are equally spaced at an interval equal to the interval between two consecutive guide slideways.

3. Device according to claim 1 adapted for use in the case where said slideways are at intervals which have one of at least two different values equal to a predetermined value or an integer multiple of said value, wherein said projecting portions are separated by an interval equal to said predetermined value or an integer multiple of said predetermined value.

4. Device according to claim 1 wherein said subrack comprises a rail near an open front side of said subrack, said coding member comprises a central longitudinal member, a plurality of attachment arms and a series of appendages perpendicular to said central longitudinal member, and said attachment arms and said central longitudinal member of said coding member are mounted on said rail near said open front side of said subrack.

5. Device according to claim 4 wherein said appendages are blade members each in a respective plane perpendicular to the length of said coding member.

6. Device according to claim 1 wherein said coding member is a stamped out, unitary bent part of sheet metal.

7. Method of associative coding printed circuit boards adapted to be connected into a subrack adapted to be fitted with a plurality of boards each of which is guided by at least one slideway which is part of a plurality of parallel spaced slideways respective to said boards each of which has a front panel in the form of a wall perpendicular to its plane adapted to close part of an open front side of said subrack when said board is inserted in said subrack, said method comprising, before inserting the first board, fitting at least one elongate coding member to said subrack comprised of a series of projecting portions disposed along the length of said member at intervals in corresponding relationship to respective intervals between two consecutive slideways, collaborating each projecting portion in plug-and-socket fashion with an opening formed in the front panel of each board to enable said board to be connected only if it is part of the same family as the first board mounted and connected into the subrack, disposing said coding member parallel to the plane of the open front side of the subrack and adapted to be movable longitudinally for fitting the first board of the family, and defining the coding of the boards of the same family by the location of said opening in the plane of the front panel of each board.

8. Method according to claim 7 wherein said slideways are equally spaced, said method comprises spacing said projecting portions at intervals equal to the interval between two consecutive slideways.

9. Method according to claim 7 wherein said slideways are at intervals which have one of at least two different values equal to a predetermined value or an integer multiple of said value, and said method further comprises separating the consecutive projecting portions by an interval equal to said predetermined value or an integer multiple of said predetermined value.

* * * * *